(12) United States Patent
Izumi et al.

(10) Patent No.: US 6,977,707 B2
(45) Date of Patent: Dec. 20, 2005

(54) DISPLAY DEVICE AND WIRING SUBSTRATE INCLUDING ELECTRIC WIRING FORMED OF CONDUCTIVE FILM

(75) Inventors: Yoshihiro Izumi, Kashihara (JP); Toshihiko Nakagawa, Matsusaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 23 days.

(21) Appl. No.: 10/454,580

(22) Filed: Jun. 5, 2003

(65) Prior Publication Data

US 2003/0227592 A1    Dec. 11, 2003

(30) Foreign Application Priority Data

Jun. 7, 2002 (JP) ............................. 2002-167416
Mar. 26, 2003 (JP) ............................. 2003-084977

(51) Int. Cl.⁷ .......................................... G02F 1/1345
(52) U.S. Cl. ..................................... 349/149; 349/152
(58) Field of Search ................................ 349/149–152

(56) References Cited

U.S. PATENT DOCUMENTS

| | | | | |
|---|---|---|---|---|
| 5,608,559 A | * | 3/1997 | Inada et al. .................. | 349/149 |
| 5,668,700 A | * | 9/1997 | Tagusa et al. ............... | 361/779 |
| 6,219,124 B1 | * | 4/2001 | Lee et al. .................... | 349/147 |
| 6,734,941 B2 | | 5/2004 | Yamazaki et al. .......... | 349/150 |
| 6,768,533 B2 | * | 7/2004 | Hanakawa et al. ......... | 349/153 |
| 6,822,720 B2 | | 11/2004 | Ueda et al. | |
| 2003/0128326 A1 | * | 7/2003 | Yamaguchi et al. ........ | 349/152 |
| 2003/0142261 A1 | * | 7/2003 | Chu et al. ................... | 349/149 |

FOREIGN PATENT DOCUMENTS

| | | | |
|---|---|---|---|
| JP | 64-76032 | * | 3/1989 |
| JP | 3-114820 U | | 11/1991 |
| JP | 4-313731 A | | 11/1992 |
| JP | 6-13724 A | | 1/1994 |
| JP | 9-179505 | | 7/1997 |
| JP | 9-189916 | | 7/1997 |
| JP | 10-070354 A | | 3/1998 |
| JP | 10-261853 A | | 9/1998 |
| JP | 10-339880 A | | 12/1998 |
| JP | 2000-349445 A | | 12/2000 |
| JP | 2001-73159 A | | 3/2001 |
| JP | 2002-338891 A | | 11/2002 |
| JP | 2002-339076 A | | 11/2002 |
| KR | 2001-0088389 A | | 9/2001 |

OTHER PUBLICATIONS

The summary of the 100th seminar of The Surface Finishing Society of Japan, The Surface Finishing Society of Japan, pp. 23-24, (1999).
NIKKEI BP Marketing, Inc., p. 26, (2002).

* cited by examiner

*Primary Examiner*—Tarifur R. Chowdhury
(74) *Attorney, Agent, or Firm*—Birch, Stewart, Kolasch & Birch, LLP

(57) ABSTRACT

A wiring substrate is arranged so that a first periphery electric wiring and a second periphery electric wiring are patterned on an active matrix substrate, and a TCP as a electronic component is provided on a portion of the patterned electric wiring. The first periphery electric wiring and the second periphery electric wiring are formed by including a metal thin film and a transferred metal film. Further, in the portion where the TCP is provided, the first periphery electric wiring and the second periphery electric wiring either have a monolayer structure with one of the metal thin film and the transferred metal film, or have a lamination structure with both of the metal thin film and the transferred metal film. On this account, connection failure can be prevented on a low resistance wiring substrate.

17 Claims, 12 Drawing Sheets

FIG. 8 (a)   CONVENTIONAL ART
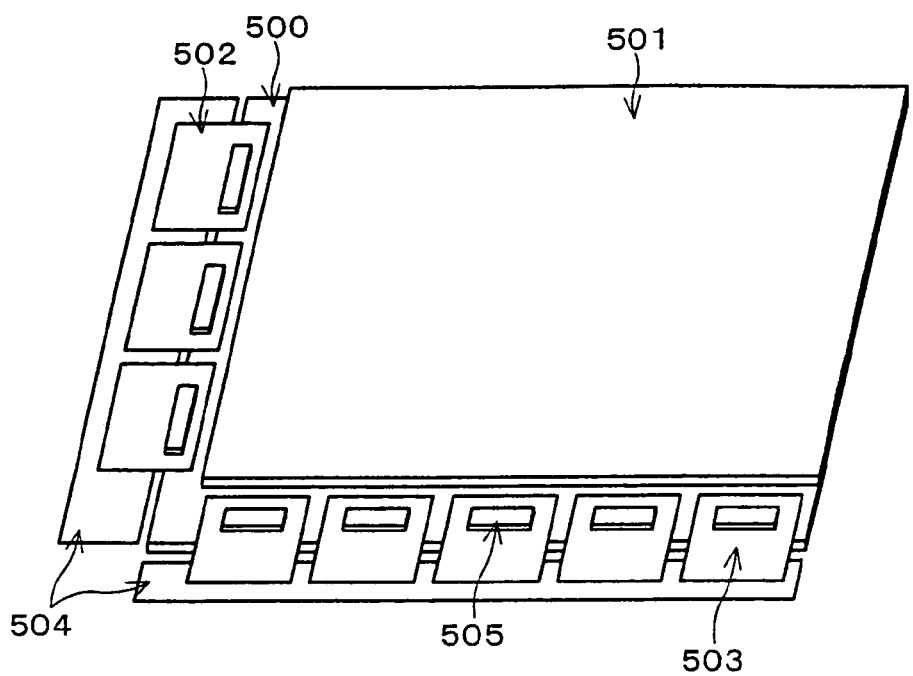
FIG. 8 (b)   CONVENTIONAL ART
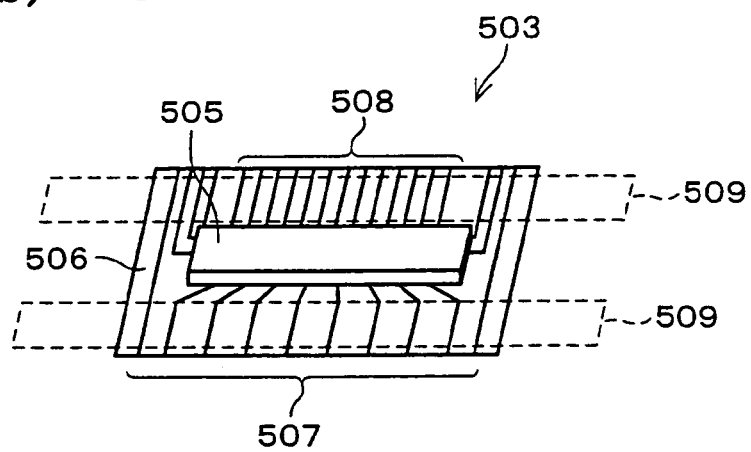

FIG. 9 (a) CONVENTIONAL ART
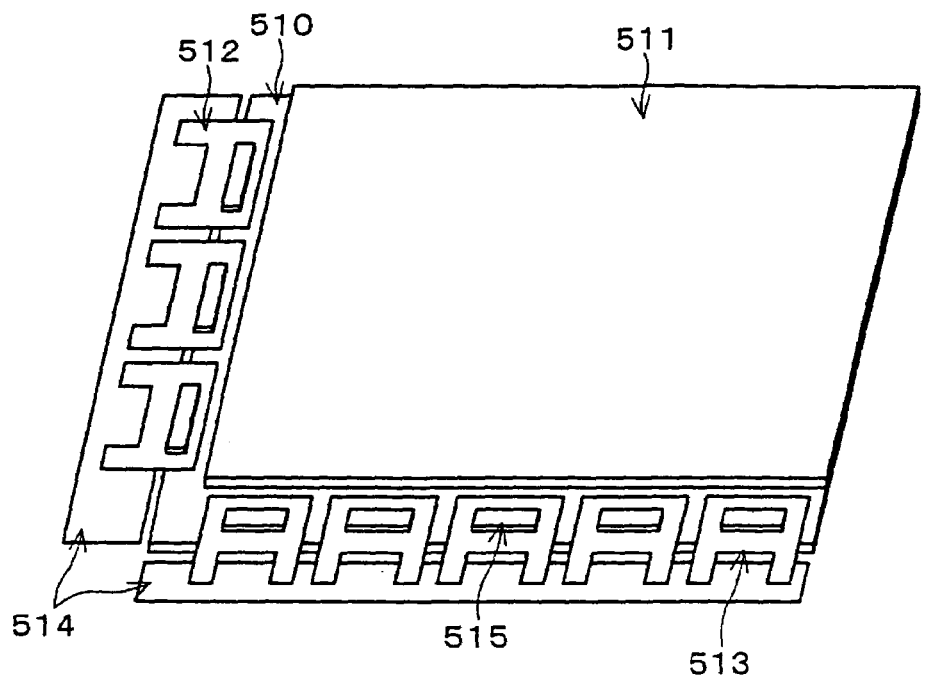
FIG. 9 (b) CONVENTIONAL ART
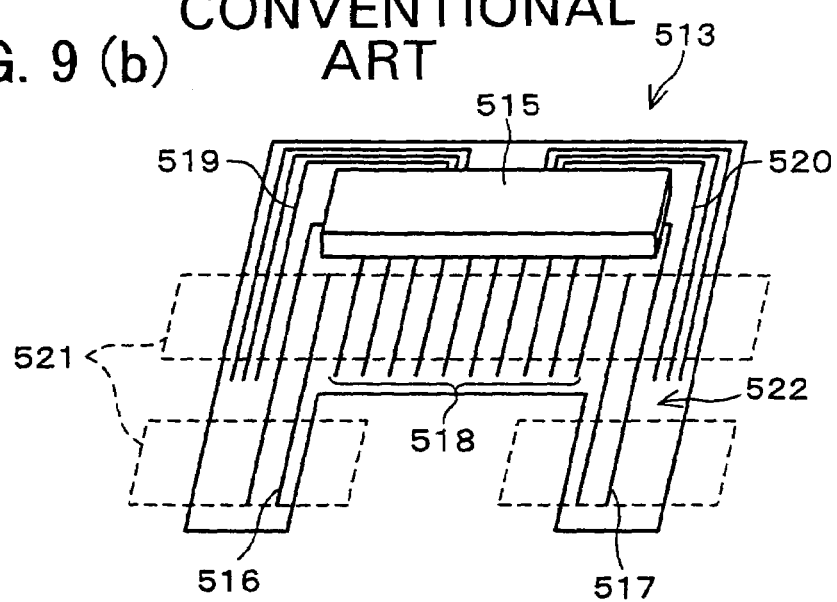

DISPLAY DEVICE AND WIRING SUBSTRATE INCLUDING ELECTRIC WIRING FORMED OF CONDUCTIVE FILM

FIELD OF THE INVENTION

The present invention relates to a wiring substrate included in an electronic device such as an AV (Audio Visual) apparatus, or an OA (Office Automatic) apparatus, so as to carry out propagation of various signals; and also relates to a display device having the wiring substrate, and further relates to a manufacturing method of the wiring substrate.

BACKGROUND OF THE INVENTION

A flat panel display device such as a liquid crystal display device is made up of a display area for carrying out image display, and a periphery area provided in the periphery of the display area. The display area designates an area for carrying out display of, for example, an image, and includes a display medium (for example, a liquid crystal layer in case of a liquid crystal display, or an EL layer in case of an EL display device) which generates an electro-optic effect or an electroluminescence effect. The display area further includes electric wiring provided on a substrate in a matrix manner for transmitting a display signal to the display medium. Meanwhile, the periphery area designates an outline area of the display area, and having periphery electric wiring required for the display, such as a leading electrode of the electric wiring provided in the display area in a matrix manner.

Generally, a driver IC for driving the display device is mounted to the periphery area by a COG (Chip on Glass) mounting method or a TCP (Tape Carrier Package) mounting method.

As one example, FIG. 8(a) shows a schematic view of a conventional liquid crystal display device which includes a driver IC mounted by a TCP mounting method. Further, FIG. 8(b) is a pattern diagram more minutely showing the arrangement of the TCP (a gate TCP 502 or a source TCP 503) of the liquid crystal display device shown in FIG. 8(a).

The display area on the lower substrate 500 of the liquid crystal display device includes signal wiring (gate wiring, source wiring: not shown) which is provided in a matrix manner. Further, an upper substrate 501 is provided on the signal wiring while covering the display area. The periphery area is an area of the lower substrate 500 not being covered by the upper substrate 501. An external circuit board 504 is provided outside of the periphery area for supplying an external signal. Further, a driver IC 505 is provided on the periphery area and the external circuit board 504 for operating as an intermediary, with plural TCPs (a gate TCP 502 or a source TCP503) for supplying a signal to the signal wiring on the display area. The external signal is supplied to the respective TCPs through the external circuit board 504.

As shown in FIG. 8(b), each of the TCPs 503 includes a driver IC 505 provided on a flexible base 506, a signal input wiring 507 for supplying an external signal to the driver IC, a signal output wiring 508 for supplying the signal outputted from the driver IC 505 to the display area, and the like. The signal input wiring 507 is electrically conducted to a terminal provided on a terminal connection section 509 of the external circuit board 504. The signal output wiring 508 is electrically conducted to a terminal connection section 509 of the periphery area on the lower substrate 500.

Incidentally, in the liquid crystal display device using the TCP mounting method, a signal is individually and directly inputted to the respective TCPs 503 from the external circuit board 504, and therefore a great number of wirings are required on the external circuit board. This causes some problems such as complication of manufacturing, an increase in costs, or a decrease of reliability. In view of these problems, Japanese Laid-Open Patent Application Tokukaihei 04-313731/1992 (published on Nov. 5, 1992), and Japanese Laid-Open Utility Model Application Jitsukaihei 03-114820/1991 (published on Nov. 26, 1991) and some other applications disclose a liquid crystal display device using a so-called "signal propagation method" as a replacement of the TCP mounting method. In this signal propagation method, a signal is first inputted to one TCP, and then sequentially propagated to the adjacent TCP one after another.

The following will explain a liquid crystal display device adopting the signal propagation method, with reference to FIGS. 9(a) and 9(b). FIG. 9(a) is a schematic view of a liquid crystal display device adopting the signal propagation method, and FIG. 9(b) is a pattern diagram more minutely showing the arrangement of the TCP (a gate TCP 512 or a source TCP513) of the liquid crystal display device shown in FIG. 9(a).

As shown in FIG. 9(a), the liquid crystal display device includes a lower substrate 510, an upper substrate 511, plural source TCPs 513 and plural gate TCPs 512 provided in the periphery of the lower substrate 510, an external circuit board 514, and the like. Further, a driver IC 515 is provided in each of the TCPs.

Further, as shown in FIG. 9(b), each of the TCPs 513 (512) includes a driver IC 515 provided on a flexible base 522, an IC driving wiring 516 as a signal input wiring for supplying an external signal to the driver IC 515, a counter electrode wiring 517, a signal output wiring 518 for supplying an image signal outputted from the driver IC 515 to the display area, relay wirings 519 and 520 for supplying/outputting a driving signal to the next adjacent TCP, and the like. Note that, the respective wirings are connected to other wirings etc. in the terminal connection section 521.

The following will explain signal exchange among the TCPs in the liquid crystal display device using the signal propagation method. Firstly, an external signal is supplied from the external circuit board 514 to the driver IC in the first TCP via the IC driving wiring 516 and the counter electrode wiring 517. Secondly, the driver IC transmits an image signal according to the external signal to the display area via the signal output wiring 518; and a part of the external signal is transmitted to the relay wirings 519 and 520. The signal transmitted to the relay wirings 519 and 520 is outputted to the relay wirings 519 and 520 in the second TCP via the connection wiring, which provides conduction among the TCPs, and further supplied to the driver IC of the second TCP. As described, in the foregoing method, a signal is first supplied to the TCP from the external circuit board 514, and a part of the signal is then supplied to a pixel of the display area through the driver IC in the TCP. The remaining signals are sequentially propagated to the next adjacent TCP via the relay wiring of the TCP and the connection wiring on the substrate.

With this signal propagation method, the number of wirings required for the input operation from the external circuit board to the TCP can be greatly reduced compared to a conventional TCP mounting method, thus realizing a simpler configuration, a smaller area, and cost reduction with respect to the external circuit board. Further, the publication Tokukaihei 04-313731/1992 and the publication Jitsukaihei 03-114820/1991 also disclose a structure not requiring the external circuit board by providing a bus line (connection wiring among the TCPs) in the periphery area of the display panel.

However, in the arrangements disclosed in the foregoing two publications, the bus line is excessively long and therefore the resistance of the connection wiring increases. Further, the wiring on the liquid crystal panel is generally formed on a glass substrate with a thin film having thickness of not more than 5 μm. Therefore, the resistance of the wiring becomes much higher than that of the external circuit board or that of the TCP, thus causing problems of such as delay of signal propagation. Particularly, the high resistance can cause a decrease of such as power source voltage for driving the liquid crystal driving IC of the TCP, and/or a decrease of power source voltage for driving the counter common electrode. If these power source voltages greatly decrease, there arises some operational problems.

In order to prevent the high resistance, the foregoing structure has to be provided with an external circuit board so as to individually input a signal to the respective TCPs, since the signal propagation is carried out under low resistance condition.

Meanwhile, Japanese Laid-Open Patent Application Tokukaihei 06-13724/1994 (published on Jan. 21, 1994) uses a bus line made of wiring (metal film) adhered to a glass substrate of a display device by transferring, instead of the wiring formed on a glass substrate by thin film forming technology. With this arrangement, the wiring can be greater than 0.5 μm (preferably in a range of to 10 μm), thus decreasing the resistance of the bus line. As a result, it is possible to provide a bus line which traverses over the whole periphery section (periphery area) of the display panel, thus realizing a display panel not using an external circuit board.

Incidentally, in the display device disclosed in the publication Tokukaihei 06-13724/1994, the bus line between the respective TCPs is made of a transferred metal film having a large thickness for the purpose of reducing the resistance; on the other hand, the leading wiring to the display area is made of the conventional thin film wiring formed by the thin film forming technology. Thus, the periphery area of the display device includes both wiring having a large thickness and wiring having a small thickness, i.e., the connection wiring as the bus line between the TCPs, and the leading wiring to the display area.

FIG. 10 is a cross-sectional view of a wiring substrate provided in a periphery area of a display device and having two wirings different in thickness. As shown in the figure, when the periphery area includes both connection wiring 531 made of a transferred metal film and leading wiring 532 made of a metal thin film, connection failure is likely to occur between connection terminals 533 formed on a TCP 534, and the respective wirings 531 and 532 formed on a glass substrate 535.

More specifically, when the TCP 534 and the glass substrate 535 are connected via an isotropic conductive adhesion material 536, conduction between the upper and lower wirings can be obtained in the portion of the connection wiring 531 having a large thickness since conductive particles included in the isotropic conductive adhesion material 536 can be sufficiently pressed. However, the leading wiring 532 having a small thickness cannot sufficiently press the conductive particles, thus causing connection failure in the portion of the leading wiring 532.

SUMMARY OF THE INVENTION

The present invention is made in view of the foregoing conventional problems, and an object is to provide a wiring substrate of an electronic device, which can realize low resistance wiring while preventing connection failure at the connection section of the wiring and electronic components provided on the wiring.

In order to solve the foregoing problems, a wiring substrate of the present invention includes a substrate; electronic components disposed on the substrate; and electric wiring patterned on the substrate and partly sandwiched between the substrate and the electronic components, so as to be electrically conducted to the electronic components, the electric wiring being formed by including a first conductive film, and a second conductive film thicker than the first conductive film, and the electric wiring either having a monolayer structure with one of the first conductive film and the second conductive film, or having a lamination structure with both of the first conductive film and the second conductive film.

The wiring substrate is included in an electronic device such as a display device, and having such an arrangement that electric wiring for transmitting various signals are patterned on a substrate in a predetermined shape. The wiring substrate further includes electronic components disposed on one portion of the substrate on which the electric wiring is patterned. The electric components are formed by including such as a transistor IC. More specifically, the portion where the electronic components are provided is arranged so that the electric wiring is sandwiched between the electronic components and the substrate, and the electronic components are connected to the electric wiring via such as an internal connection terminal.

Further, the electric wiring is formed by including two kinds of conductive films, i.e., the first conductive film and the second conductive film. The second conductive film is thicker than the first conductive film, and therefore having smaller resistance. Further, the electric wiring provided between the electrical components and the substrate either has a monolayer structure with one of the first conductive film and the second conductive film, or has a lamination structure with both of the first conductive film and the second conductive film. Namely, since the electric wiring does not include both the monolayer structure and the lamination structure together in the portion sandwiched between the substrate and the electronic components, there is no level difference between the monolayer structure and the lamination structure in the electric wiring.

With the foregoing arrangement, resistance of the wiring substrate can easily be reduced by including a thick conductive film in a portion of the electric wiring. Besides, the electric wiring has an uniform thickness, as it does not include both the monolayer structure and the lamination structure together in the portion sandwiched between the substrate and the electronic components. Therefore, since there is no level difference, stable conduction can be provided without connection failure in the electric wiring for carrying out electrical conduction with the electronic components. Namely, the wiring substrate of the present invention can solve the connection failure which occurs in the conventional low resistance wiring substrate.

Note that, Japanese Laid-Open Patent Application Tokukaihei 10-339880/1998 (published on Dec. 22, 1998) discloses a liquid crystal display device in which an image signal line for supplying an image signal to a pixel area is made up of a first metal layer and a second metal layer which are partly superimposed to each other. However, the liquid crystal display device disclosed in Tokukaihei 10-339880 has a different object of that of the present invention, as it is aimed to prevent a delay difference of the image signal among the signal lines, and therefore has a different structure from that of the present invention.

A display device of the present invention includes a display area for displaying an image; and a periphery area provided on a periphery of the display area for transmitting a signal to the display area, the periphery area including a wiring substrate having a substrate; electronic components disposed on the substrate; and electric wiring patterned on the substrate and partly sandwiched between the substrate and the electronic components so as to be electrically conducted to the electronic components, the electric wiring including a first conductive film, and a second conductive film thicker than the first conductive film, and the electric wiring either having a monolayer structure with one of the first conductive film and the second conductive film, or having a lamination structure with both of the first conductive film and the second conductive film.

With the foregoing arrangement in which the wiring substrate is included in the periphery area of a display device, a low resistance wiring structure can be created. Thus, signal transmission can be desirably performed in a display device using a signal propagation method even with long connection wiring. Further, it is possible to prevent connection failure at the connection section of the electric wiring with respect to the electronic components including such as a driver IC.

A manufacturing method of the wiring substrate of the present invention includes the steps of: (a) forming a first conductive film on a substrate; (b) laminating a second conductive film thicker than the first conductive film on at least one portion of the first conductive film, so as to form electric wiring; and (c) disposing electronic components on the electric wiring by excluding a portion having level difference due to the laminating of the first conductive film and the second conductive film in the step (b).

With the foregoing method, the resistance of the electric wiring of the wiring substrate can be reduced by providing the second conductive film thicker than the first conductive film. Further, even in case of having the lamination structure of the first conductive film and the second conductive film, the electronic components are provided on an area not having a level difference due to the lamination, i.e., the monolayer structure portion with one of the first conductive film and the second conductive film, or on the lamination structure portion with both of the first conductive film and the second conductive film. Thus, the thickness of the electric wiring is uniform in the connection portion with respect to the electronic components, thus preventing connection failure due to the thickness difference.

A display device of the present invention includes a display area for displaying an image; and a periphery area provided on a periphery of the display area, and including electric wiring patterned on a substrate for transmitting a signal to the display area, the electric wiring being formed by including a first conductive film and a second conductive film thicker than the first conductive film, and the second conductive film being a transferred film which is first formed on a supporting base separated from the substrate, and then transferred to the substrate, and the first conductive film and the second conductive film being adhered together through an adhesion member having an anisotropic conduction characteristic.

With the foregoing arrangement, it is possible to electrically and mechanically connect the first conductive film to the second conductive film having low resistance and provided on the first conductive film. Further, since the adhesion member has an anisotropic conduction characteristic, it is possible to prevent a short circuit between adjacent ones of periphery electric wirings, thus desirably transmitting a signal to the display area.

Additional objects, features, and strengths of the present invention will be made clear by the description below. Further, the advantages of the present invention will be evident from the following explanation in reference to the drawings.

BRIEF DESCRIPTION OF THE DRAWINGS

FIG. 8(a) is a schematic view of a conventional liquid crystal display device includes a driver IC connected by a TCP mounting method. FIG. 8(b) is a pattern diagram more minutely showing the arrangement of the TCP of the liquid crystal display device shown in FIG. 8(a).

FIG. 9(a) is a schematic view of a liquid crystal display device of a conventional signal propagation method, and FIG. 9(b) is a pattern diagram minutely showing an arrangement of a TCP included in the liquid crystal display device shown in FIG. 9(a).

DESCRIPTION OF THE EMBODIMENTS

The following will explain one embodiment of the present invention with reference to FIG. 1(a) through FIG. 7, FIG. 11, and FIGS. 12(a) through 12(c). Note that, the present invention is not limited to the following description.

Figure 2:
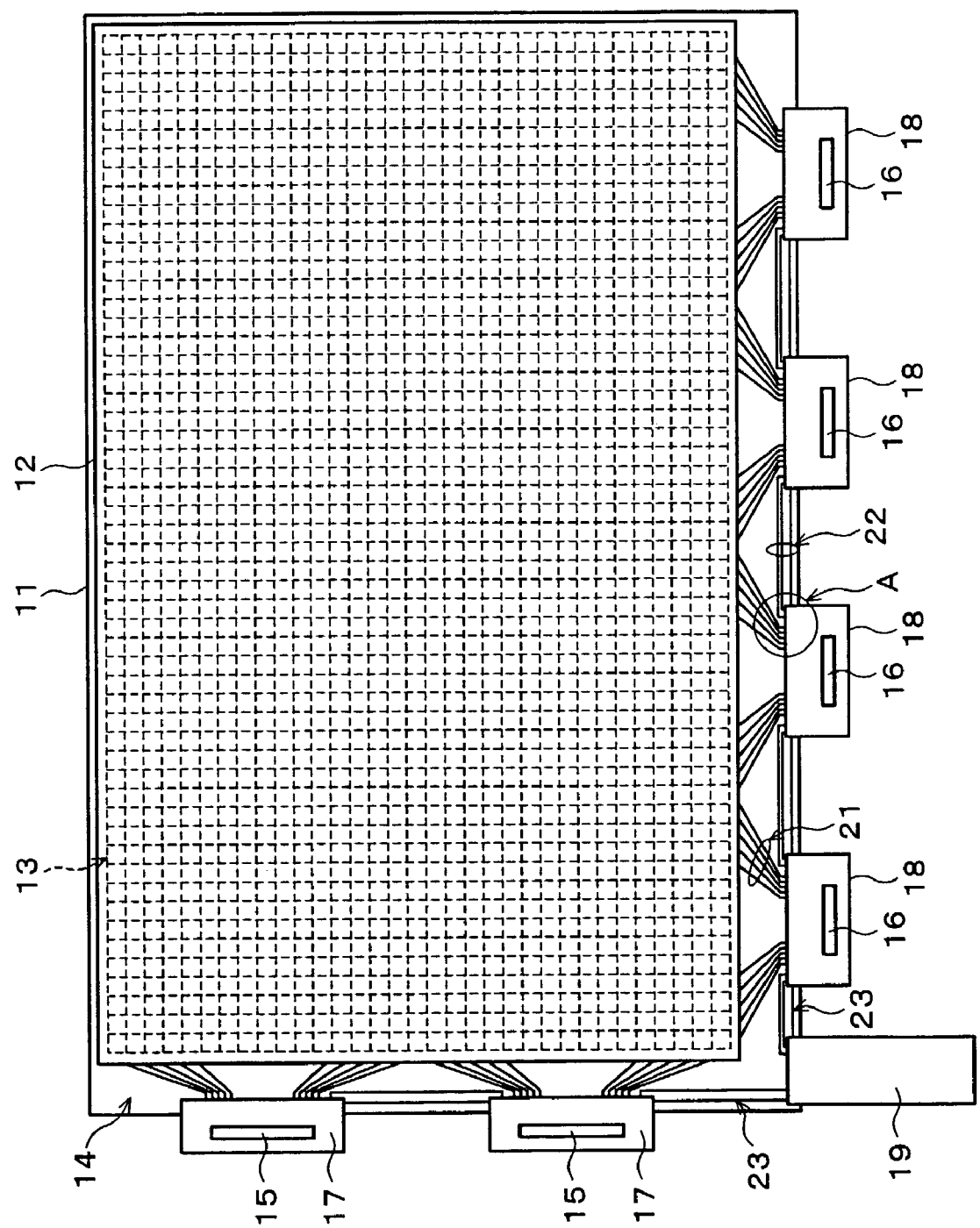
FIG. 2 is a schematic plan view showing a liquid crystal display panel having a wiring substrate according to the present invention.

An active matrix liquid crystal display device having a TFT (Thin Film Transistor) element is used as an example of the present embodiment. FIG. 2 is a schematic plan view of a liquid crystal display panel (display device) having a wiring substrate according to the present invention. As shown in the figure, this liquid crystal display panel is made of an active matrix substrate (substrate) 11 and a counter substrate 12 which are bonded together in a state where the active matrix substrate 11 is partly exposed. Further, the liquid crystal display panel includes a liquid crystal layer between the pair of substrates. In FIG. 2, a display area 13 inside the counter substrate 12 is depicted by a lattice pattern. The display area 13 displays an image according to an image signal. The area other than the display area 13, i.e., the periphery area of the display area 13 is referred to as a frame area 14 (periphery area) in the present embodiment. The wiring substrate according to the present embodiment is provided in the frame area 14.

The active matrix substrate 11 includes matrix wiring (electric wiring) made of scanning lines and signal lines disposed in a state of a lattice pattern, switching elements (TFT elements) provided for the respective pixels, and pixel electrodes etc., which are all formed on a glass substrate. The counter substrate 12 includes common electrodes. The frame area of the active matrix substrate 11 includes a plurality of gate drivers IC15 directing line-sequential scanning of the scanning lines and a plurality of source drivers IC 16 supplying an image data signal to the signal lines. As shown in FIG. 2, the liquid crystal display panel of the present embodiment has a structure in which the gate and source drivers 15 and 16 are mounted by a TCP mounting method (also called a TAB mounting method) as electronic components.

The TCP mounting method designates a method to connect a TCP (electronic component), having an IC chip formed on a flexible base such as a polyimide film, to a display panel. Note that, a TCP having the gate driver IC 15 is referred to as a gate TCP17, and a TCP having the source driver IC 16 is referred to as a source TCP18.

Further, an FPC 19 used for signal input is provided on the display panel by being connected to a portion of the frame area 14. The FPC 19 operates to externally supply various electric signals (such as an image data signal) or a power source for driving the driver ICs 15 and 16 (such as an IC driving power source voltage, or a common electrode driving power source voltage) with respect to the display panel. In the liquid crystal display panel of the present invention, an image data signal for carrying out image display, a driving power source for the driver ICs 15 and 16, an electric signal for the common electrode in the counter substrate 12 etc. are all supplied via the FPC 19. The number of wirings is reduced in this arrangement since the supplied various signals are sequentially propagated through the wirings inside of the respective gate TCPs 17 or the source TCPs 18. Namely, the liquid crystal display panel of the present invention adopts a "signal propagation method". On this account, the liquid crystal display panel does not require a conventionally-used large external circuit board (PWB), and therefore the area other than the display area 13 can be reduced.

The frame area 14 includes a plurality of wirings, which roughly fall into a first periphery electric wiring 21 (electric wiring for the display area) for outputting an image data signal to the display area 13, and a second periphery electric wiring 22 for electrically connecting adjacent TCPs 17 to each other and adjacent TCPs 18 to each other. More specifically, the second periphery electric wiring 22 connects plural adjacent electronic components to each other.

Note that, in the present embodiment, the second periphery electric wiring also includes the electric wiring for electrically connecting the FPC 19, and the gate TCP17 or the source TCP18. Further, the second periphery electric wiring is made up of plural electric wirings, and preferably, at least one of them includes the electric wiring 23 which supplies power to the drivers 15 and 16.

Here, the matrix wiring provided in the display area 13 is made of a conductive material such as a metal of not more than 0.5 $\mu$m (preferably in a range from 0.1 to 0.4 $\mu$m) by a thin film forming process for forming a TFT element. A concrete example of the conductive material may be Al, Ta, Mo, Cr, or Ti. Then, a single layer film, a lamination layer film, an alloy film or the like are formed by such as the foregoing materials so as to constitute the matrix wiring.

Further, the first periphery electric wiring 21 and the second periphery electric wiring 22 (electric wiring) provided on the frame area 14 include a first conductive film and a second conductive film. The first conductive film is a metal film made of the same material and by the same manufacturing process as that of the matrix wiring of the display area 13. The second conductive film is a transferred metal film having a greater thickness than that of the metal thin film and formed by a different manufacturing process. The following will explain the structures and the forming methods of the first periphery electric wiring 21 and the second periphery electric wiring 22.

Figure 3:
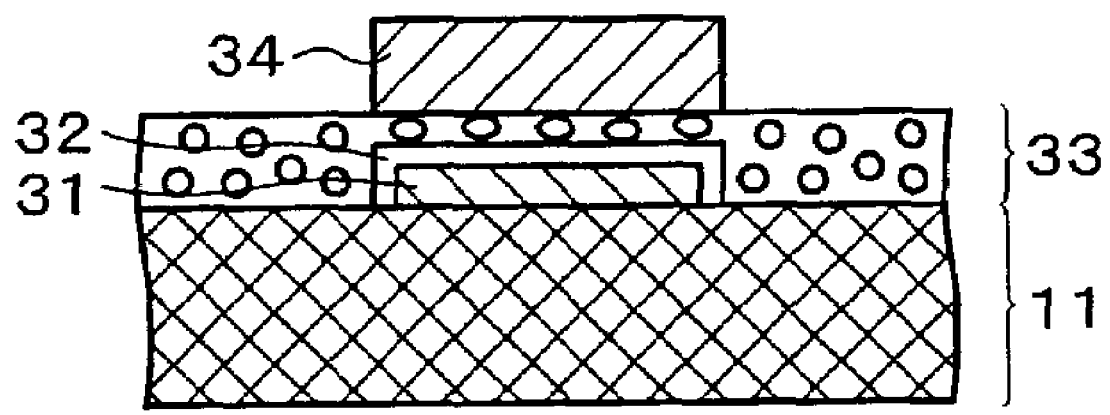
FIG. 3 is a cross-sectional view showing an example of the section structure of a second periphery electric wiring inside of a wiring substrate provided in the frame area.
Figure 4:
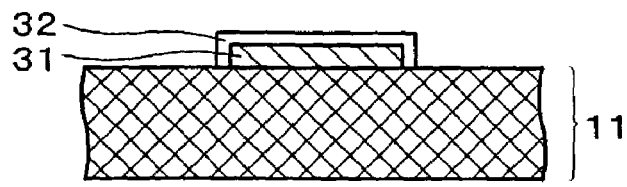
FIGS. 4(a) through 4(d) are cross-sectional views of a wiring substrate showing each process for forming the second periphery electric wiring.
Figure 4:
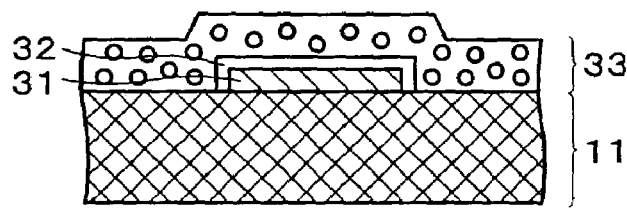
Figure 4:
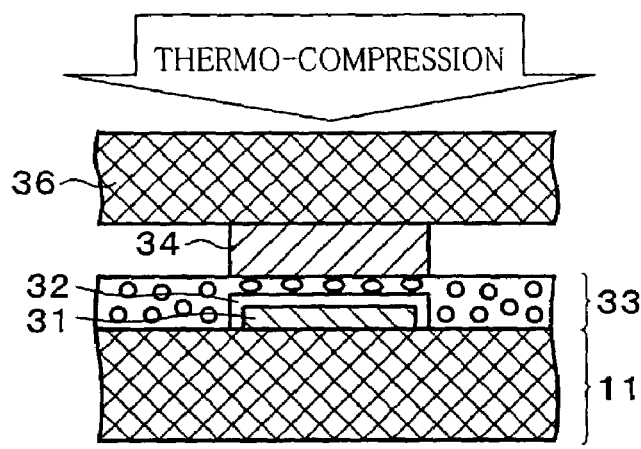
Figure 4:
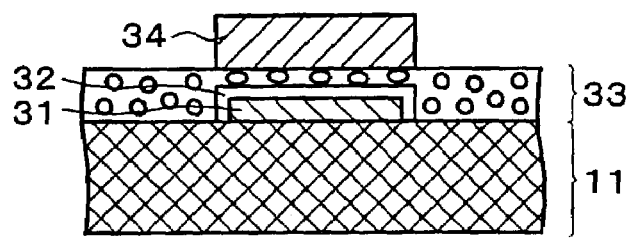
Figure 5:
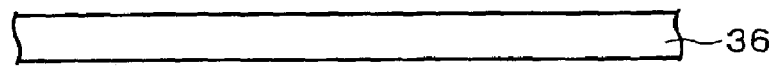
FIGS. 5(a) through 5(f) are cross-sectional views of a transferred film showing respective manufacturing processes in a sequence as an example of a method for forming a transferred metal film on a supporting film.
Figure 5:
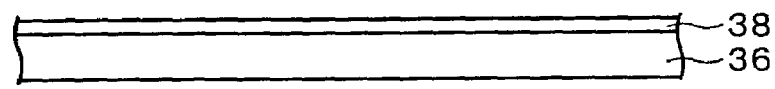
Figure 5:
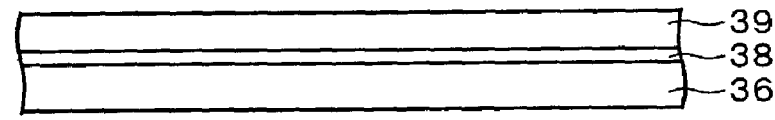
Figure 5:
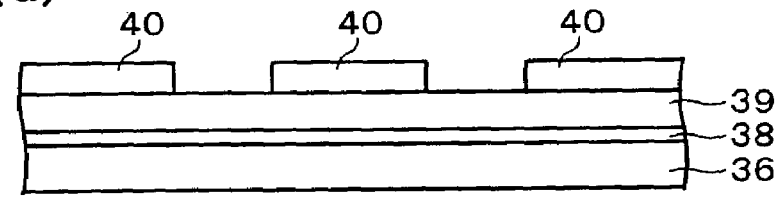
Figure 5:
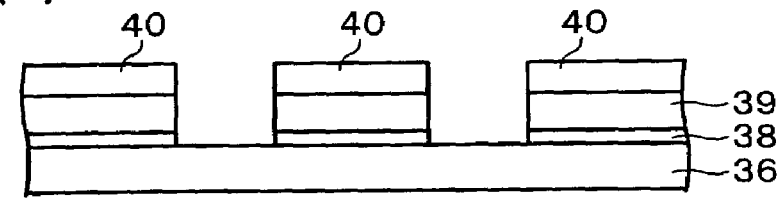
Figure 5:
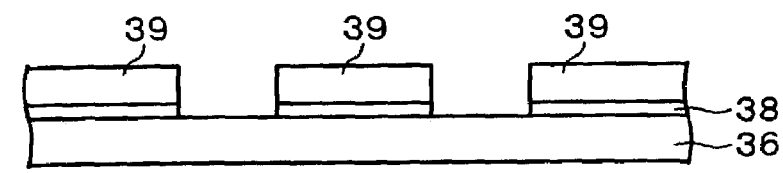
Figure 6:
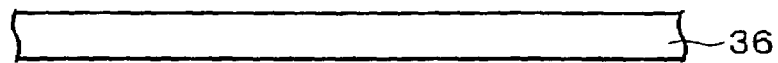
FIGS. 6(a) through 6(f) are cross-sectional views of a transferred film showing respective manufacturing processes as a variation example of the method for forming a transferred metal film shown in FIGS. 5(a) through 5(f).
Figure 6:
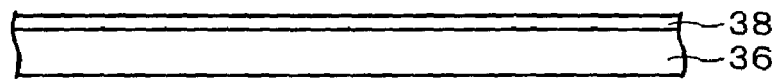
Figure 6:
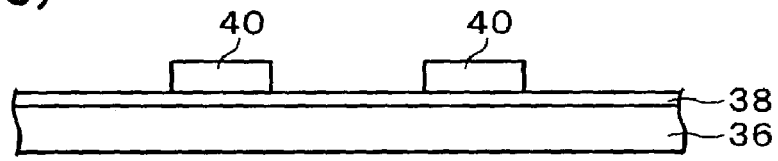
Figure 6:
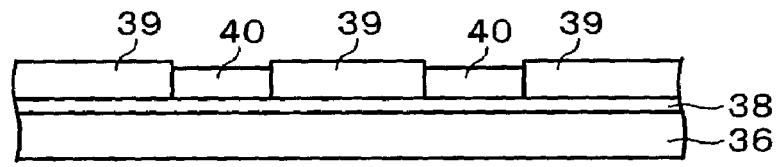
Figure 6:
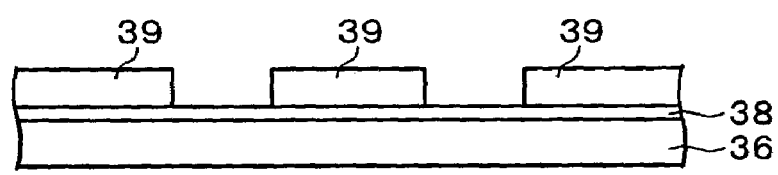
Figure 6:
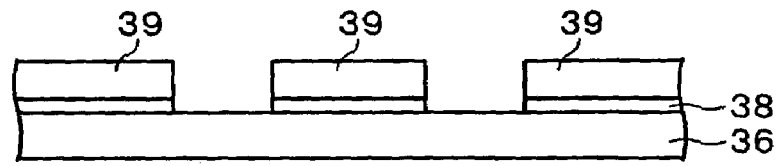

FIG. 3 is a cross-sectional view showing an example of the section structure of the second periphery electric wiring 22 included in a wiring substrate provided in the frame area 14. A metal thin film 31 is formed on a surface of the active matrix substrate 11. Further, a conductive oxide film 32 is stacked on an upper layer of the metal thin film 31 for preventing corrosion/oxidization of the metal thin film 31. Note that, the conductive oxide film 32 is not necessarily required. On an upper layer of the conductive oxide film 32, a transferred metal film 34 having low resistance is provided via an anisotropic conductive adhesion material (adhesion member) 33. The transferred metal film 34 may be made of a material having a low resistance rate such as Cu, Ag, Ni, Au or Al. The transferred metal film 34 can be a single layer film, a lamination layer film, an alloy film or the like made of these materials.

Further, it is more preferable that the transferred metal film 34 includes Cu as its material. The thickness of the transferred metal film 34 is greater than that of the metal thin film 31 provided under the transferred metal film 34, and further the thickness is preferably in a certain range of not less than 1 $\mu$m and not more than 15 $\mu$m. This arrangement can provide an electric wiring having desirably low resistance for connecting the adjacent drivers 15 (TCPs 17) to each other and the adjacent drivers 16 (TCPs 18) to each other. Therefore, the transferred metal film 34 may also be called a low resistance metal film. In the liquid crystal display panel of the present embodiment, the first periphery electric wiring 21 and the second periphery electric wiring 22 are partly formed as a lamination structure including both the metal thin film 31 and the transferred metal film 34. Note that, the portion excluding the lamination structure is provided as a monolayer structure of either of the metal thin film 31 or the transferred metal film 34.

Next, the following will explain a forming method of the second periphery electric wiring 22, which is, as described, partly formed as a lamination structure of the metal thin film 31 and the transferred metal film 34. FIGS. 4(a) through 4(d) are cross-sectional views of a wiring substrate showing each process for forming the second periphery electric wiring 22.

Firstly, as shown in FIG. 4(a), the metal thin film 31 is patterned on the active matrix substrate 11 as the lower layer of the second periphery electric wiring 22. This process is carried out with the thin film forming process for forming the TFT element in the display area 13, and the metal thin film 31 is patterned at the same time of patterning the TFT element. Al, Ta, Mo, Cr or Ti is preferable for the material of the metal thin film 31. The metal thin film 31 is patterned by forming such as a single layer film, a lamination layer film, an alloy film or the like with the foregoing materials etc. through a publicly-known photolithography or etching. After forming the metal thin film 31, a conductive oxide film is formed by such as an ITO (Indium Tin Oxide) or IZO (Indium Zinc Oxide) to be laminated on the metal thin film 31.

Next, as shown in FIG. 4(b), the anisotropic conductive adhesion material 33 is provided on the metal thin film 31. The anisotropic conductive adhesion material 33 can be an ACF (Anisotropic Conductive Film) or an ACP (Anisotropic Conductive Paste) in which conductive particles (for example, a conductive particle made of a plastic ball coated with a Au/Ni layer) are dispersed in a binder (binding agent) of an insulative resin. The insulative resin preferably has a thermosetting characteristic or a thermoplastic characteristic, so as to generate adherence by heating. The anisotropic conductive adhesion material 33 may be provided only on the pattern of the metal thin film 31, or may be provided over the surface so as to entirely coat the plural metal thin films 31.

Next, as shown in FIG. 4(c), the transferred metal film 34 is created by transferring a metal film to the pattern of the metal thin film 31 through the anisotropic conductive adhesion material 33. The metal film, which is to be the transferred metal film 34, is patterned on a supporting film 36 (supporting base, apart from the display panel) according to the shape of the wiring. This transfer process is preferably performed by thermal compression bonding with the temperature of 150 to 200° C. with respect to the upper surface of the supporting film 36 placed on the wiring substrate. The metal thin film 31 and the transferred metal film 34 patterned in such a manner are electrically conducted through the anisotropic conductive adhesion material 33.

Next, as shown in FIG. 4(d), the supporting film 36 is removed. In the present embodiment, it is preferable to provide a resin layer between the supporting film 36 and the pattern of the transferred metal film 34. This resin layer should be made of a resin having an photodegradation characteristic (preferably a resin having an ultraviolet disintegration) which decreases the adherence (or stickiness) by light irradiation (preferably ultraviolet irradiation), or a resin thermoplastic resin which decreases the adherence by heat. With this arrangement, the transferred metal film 34 can easily be removed from the supporting film 36 through light irradiation or heating.

Further, a discoloration inhibitor such as a surfactant (for example, En-Tech CU provided by Meltex Inc., or BT-7 provided by KITAIKE metal finishing product) may be appropriately applied on the surface of the transferred metal film 34 after transferring process, for the protection purpose. The use of the discoloration inhibitor is particularly preferred when the transferred metal film 34 includes copper (Cu). With this arrangement, the wiring can be prevented from having high resistance due to corrosion/oxidization of the surface of Cu. Thus, the foregoing forming method can provide a metal film (the transferred metal film 34) having low resistance on the second periphery electric wiring 22, and also can provide low resistance wiring. Note that, this arrangement of low resistance wiring may also be adopted for the first periphery electric wiring 21.

Next, the following will explain a method of forming the transferred metal film 34 on the supporting film 36. FIGS. 5(a) through 5(f) are cross-sectional views of a transferred film showing respective manufacturing processes as an example of the forming method.

Firstly, as shown in FIG. 5(a), a polyimide film is prepared as the supporting film 36. Note that, the surface of the supporting film 36 may be appropriately roughened up with an alkaline solution such as a potassium hydroxide (KOH). Next, as shown in FIG. 5(b), a Cu film 38 is formed on the surface of the supporting film 36 by electroless plating. This process can be carried out by applying a catalyst such as Pd to the supporting film 36 before soaking the film in a commercially-produced electroless Cu plating bath. Next, as shown in FIG. 5(c), a Cu plating film 39 is formed by electroplating further on the Cu film 38 thus formed by electroless plating, so as to make a thicker Cu film. Here, the Cu film may be formed only by the electroless plating method; however, it will take considerable time to form a thick Cu film. For this reason, as explained in the present embodiment, it is more preferable to adopt both electroless plating and electroplating so as to obtain a Cu film having $\mu$m thickness.

Next, as shown in FIG. 5(d), a resist pattern 40 is formed on the upper surface of the Cu plating film 39 according to the shape of the wiring pattern. The resist pattern 40 is preferably made of a resist resistant to the plating bath, such as a dry film resist having photosensitivity. Next, as shown in FIG. 5(e), the Cu films 38 and 39 are subjected to etching so as to remove unnecessary areas. The etching of Cu can easily be performed by using an acidic solution of iron chloride. Next, the resist pattern 40 is removed as shown in FIG. 5(f).

In such a manner, the transferred metal film 34 (the Cu film 38 by electroless plating and the Cu film 39 by electroplating: a film for transferring) is formed on the supporting film 36. FIGS. 6(a) through 6(f) are cross-sectional views of a transferred film showing respective manufacturing processes as a variation example of the method of forming a transferred metal film shown in FIGS. 5(a) through 5(f). In this variation example, the resist pattern 40 is first formed on the electroless plating Cu film 38 before forming the Cu plating film 39 (see FIGS. 6(c) and 6(d)). Thereafter, the resist pattern is removed (FIG. 6(e)), and only the exposed surface of the Cu film (the surface portion of the electroless plating Cu film 38 and the Cu plating film 39) is removed by etching (FIG. 6(f)).

The described method of forming a Cu film by electroless plating method on a polyimide transferred film, and the patterning method may be carried out by referring to Japanese Laid-Open Patent Application Tokukai 2001-73159 (published on Mar. 21, 2001). Further, the transferred metal film may also be formed in such a manner that an Ag pattern is formed on a polyimide film by using ultraviolet with a method disclosed in *The summary of the 100th seminar of The Surface Finishing Society of Japan* (published on Sep. 17, 1999 by The Surface Finishing Society of Japan) Pages 23 and 24, and then the Ag pattern is selectively plated with Cu.

Figure 7:
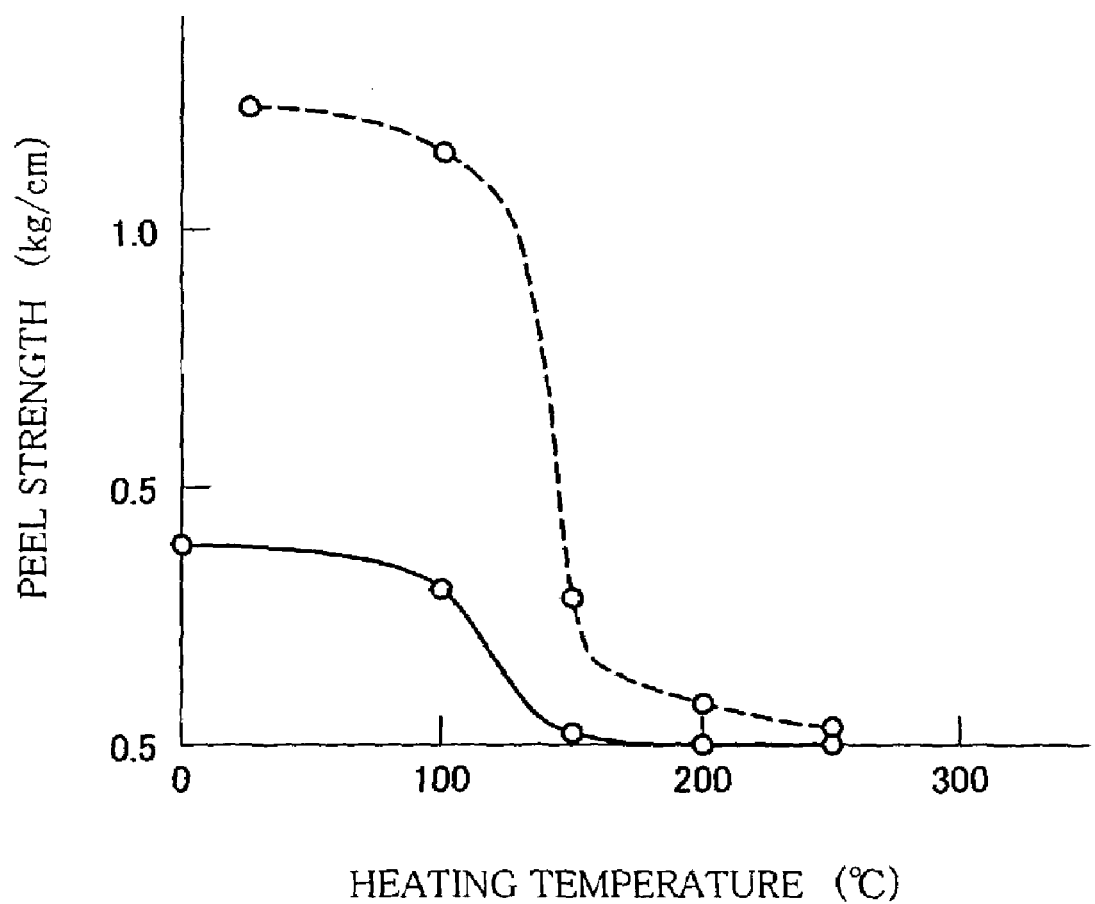
FIG. 7 is a graph showing the relation between the peel strength of a Cu film formed by an electroless plating method on a polyimide film, and the heating temperature.
Figure 10:
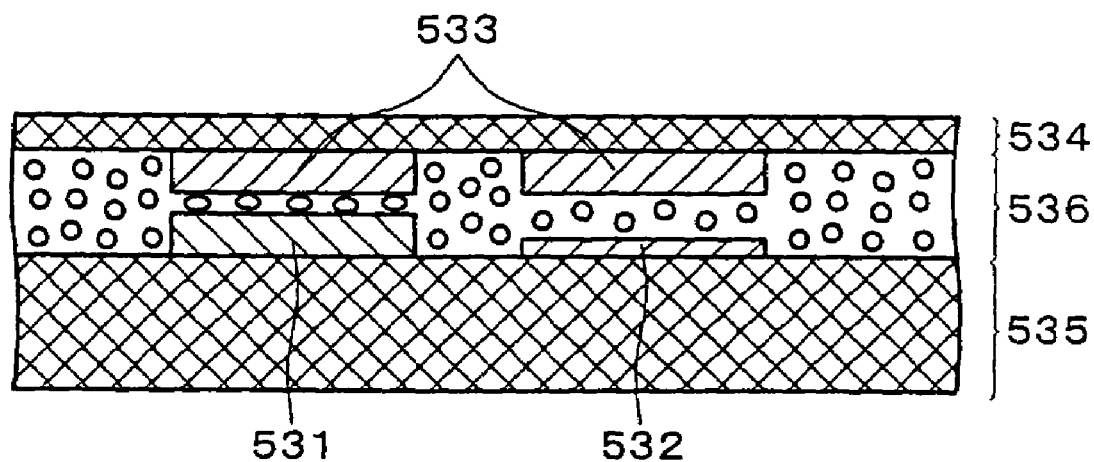
FIG. 10 is a cross-sectional view of a wiring substrate which is provided in a periphery area of a display device and includes two wirings different in thickness.

Here, with reference to FIG. 7, the following will explain the relation between the adherence (peel strength) of a Cu film formed on a polyimide film by a electroless plating method, and the heating temperature. FIG. 7 is a graph showing the correlation between the peel strength of a Cu film formed on a polyimide film, and the heating temperature. The horizontal axis of the graph denotes the heating temperature (° C.) and the vertical axis of the graph denotes the peel strength (kg/cm). Further, the solid line in the graph represents the case where the surface of the polyimide film is not processed, and the broken line represents the case where the surface of the polyimide film is processed by chemical etching. As the graph of FIG. 7 reveals, the polyimide significantly decreases its peel strength and becomes easily peeled off by heating of around 150° C.

Namely, with the heating process, the adherence between the Cu films 38 and 39, and the supporting film 36 made of a polyimide decreases, and therefore they can be easily disjoined. Accordingly, by carrying out the heating process while also applying pressure with respect to the supporting film 36 having the Cu films 38 and 39, which are formed by the foregoing manner, and placed on a predetermined portion of an active matrix substrate, the Cu films 38 and 39 are easily transferred onto the active matrix substrate. Here, the thickness of the Cu films 38 and 39 (the total thickness of the electroless plating Cu film 38 and the Cu plating film 39) is preferably in a range of 5 to 15 μm.

The types of the supporting film 36 and the transfer process are not limited to the foregoing examples in the present invention. Other examples may be Japanese Laid-Open Patent Application Tokukaihei 10-70354/1998 (published on Mar. 10, 1998), and Japanese Laid-Open Patent Application Tokukai 2000-349445 (published on Dec. 15, 2000), and further, a sort of transfer tape for forming a circuit disclosed in *Nikkei electronics* (the issue of Mar. 11, 2002, published by Nikkei BP marketing Inc.) Pages 26 and 27 may also be adopted in the present invention. Further, a polyimide having small elasticity is preferably used for the material of the supporting film 36, in case of forming a high definition circuit wiring requiring high patterning accuracy. On the other hand, in case of forming circuit wiring requiring low patterning accuracy, a material of lower cost than a polyimide is preferably used, such as a PET (Polyethylene Terephthalate), a PES (Polyether Sulfone), or an epoxy.

Figure 1:
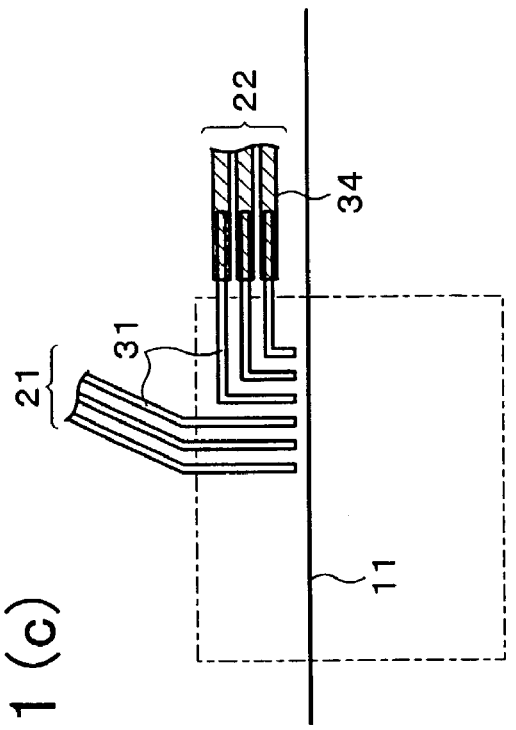
FIGS. 1(a) through 1(d) are schematic views showing wiring patterns of a portion denoted by a circle A in a frame area of the liquid crystal display panel shown in FIG. 2.
Figure 1:
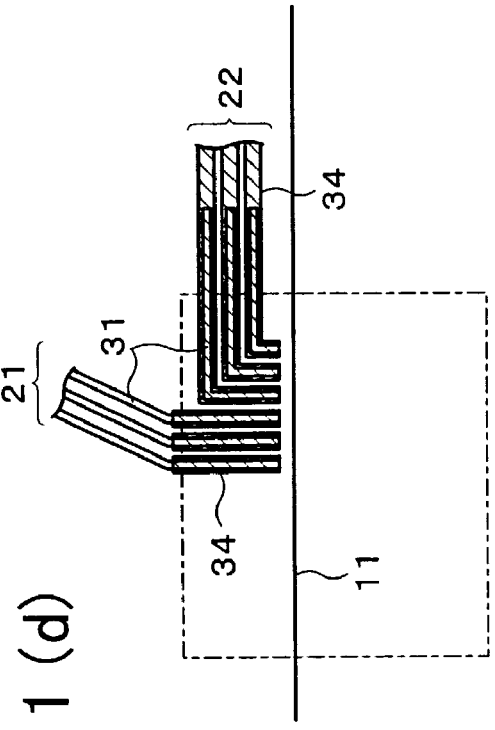
Figure 1:
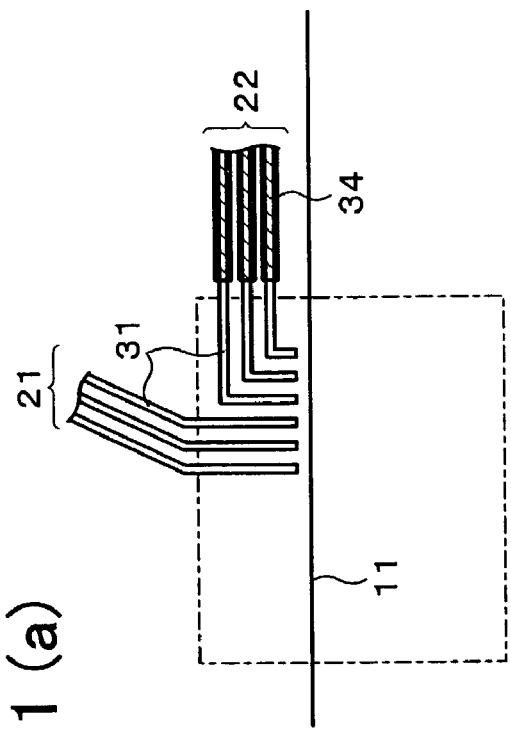
Figure 1:
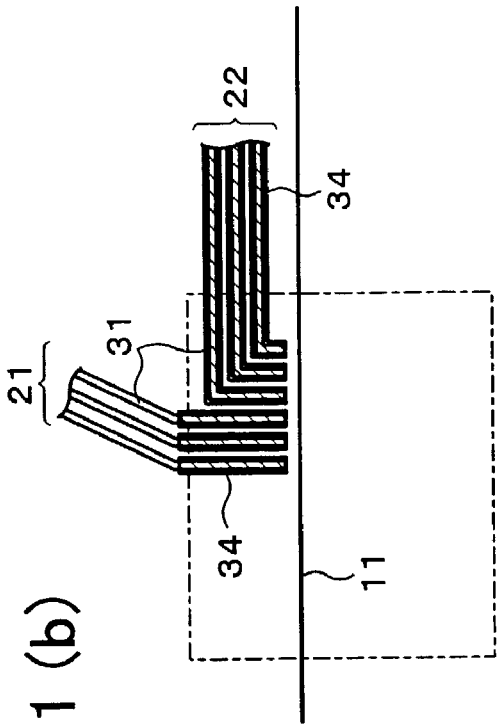

Next, with reference to FIGS. 1(*a*) through 1(*d*), the following will explain a preferable example of wiring layout of the first and second periphery electric wirings 21 and 22 provided in the frame area 14 of the liquid crystal panel. FIGS. 1(*a*) through 1(*d*) are schematic views showing different wiring patterns to be provided in a portion denoted by a circle A in the frame area 14 of the liquid crystal display device shown in FIG. 2. More specifically, FIGS. 1(*a*) through 1(*d*) show a state where the first periphery electric wiring 21 and the second periphery electric wiring 22 are formed on the active matrix substrate 11. Note that, the dashed line denotes a portion where the source TCP 18 will be mounted in a state where the first and second periphery electric wirings 21 and 22 are sandwich therein. The area denoted by the dashed line is referred to as a TCP mounting area. Further, in the first and second periphery electric wirings 21 and 22, a portion including the metal thin film 31 is denoted as a blank area, and a portion including a transferred metal film is denoted with diagonal lines. Further, the area in the figure where the metal thin film 31 and the transferred metal film are overlapped denotes a portion having a lamination structure of the metal thin film 31 and the transferred metal film. This lamination area is conducted via the anisotropic conductive adhesion material 33.

In the example shown in FIG. 1(*a*), the first periphery electric wiring 21 is formed only of the metal thin film 31. In the second periphery electric wiring 22, a portion which includes the TCP mounting area is formed only of the metal thin film 31. Other area of the second periphery electric wiring 22 has the lamination structure of the metal thin film 31 and the transferred metal film 34.

Further, in the example shown in FIG. 1(*b*), both the first and second periphery electric wirings 21 and 22 have the lamination structure of the metal thin film 31 and the transferred metal film 34, in the TCP mounting area. The area other than the TCP mounting area has the same structure as that of FIG. 1(*a*). The examples shown in FIGS. 1(*c*) and 1(*d*) are variation of the structures shown in FIGS. 1(*a*) and 1(*b*). In FIGS. 1(*c*) and 1(*d*), the connection wiring (a portion of the second periphery electric wiring 22) between two adjacent source TCPs has the monolayer structure of the transferred metal film 34. Note that, in the TCP mounting area of FIGS. 1(*c*) and 1(*d*), the first and second periphery electric wirings 21 and 22 are conducted to each other via a connection terminal of the TCP (not shown) and the anisotropic conductive adhesion material.

As described, in the first and second periphery electric wirings 21 and 22 shown in FIGS. 1(*a*) through 1(*d*), the area sandwich between the active matrix substrate 11 and the source TCP 18 has either a monolayer structure of the metal thin film 31, or a lamination film structure of the metal thin film 31 and the transferred metal film 34. Further, the connection wiring between the adjacent sources TCPs 18, which is a portion of the second periphery electric wiring 22, includes at least the transferred metal film 34. Note that, the area other than the TCP mounting area of the first periphery electric wiring 21 is preferably formed only of the metal thin film 31, since the area is the wiring lead to the display area 13.

Accordingly, by adopting one of the wiring patterns shown in FIGS. 1(*a*) through 1(*d*), the equal thickness can be provided for the first periphery electric wiring 21 and the second periphery electric wiring 22 in the TCP mounting area. On this account, it is possible to prevent occurrence of TCP connection failure due to the difference in thickness of the wirings. Further, since the portion of the second periphery electric wiring 22 as the connection wiring between the adjacent source TCPs 18 includes the transferred metal film 34 having low resistance, various external signals from a driving power source etc. can be propagated between the adjacent source TCPs 18 through low resistance wiring. Note that, the present embodiment deals with the mounting area of the source TCP 18; however, since the same effect can be expected with respect to the mounting area of the gate TCP17, the foregoing wiring structure is preferably adopted also for the gate TCP17. Note that, in the present embodiment, it is preferable that the second periphery electric wiring 22 includes the power source wiring 23 for electrically connecting the drivers 15 and 16, and an external driving power source.

Further, though it is not shown in FIGS. 1(*a*) through 1(*d*), the present invention allows an arrangement in which the first and second periphery electric wirings 21 and 22 have the monolayer structure of the transferred metal film 34, in the TCP mounting area.

As described, the liquid crystal display panel (display device) including the wiring substrate of the present invention can realize low resistance wiring (the second periphery electric wiring 22) for connecting the respective TCPs, by using the pattern of the transferred metal film 34.

Namely, in the foregoing liquid crystal display panel, the two adjacent TCPs (plural electronic components) are connected to each other via the second periphery electric wiring 22 including the second conductive film having low resistance. This arrangement allows provision of a bus line which traverses over the whole frame area of the liquid crystal display panel without increasing the resistance of the electric wiring between the adjacent TCPs. On this account, it is possible to obtain a liquid crystal display panel not requiring an external circuit board.

Further, in the foregoing liquid crystal display device, the power source wiring 23 is provided as one of the second periphery electric wiring, and therefore includes the second conductive film, thus desirably carrying out propagation of a driving signal supplied from the power source.

The foregoing embodiment deals with the electric wiring forming method in which the second conductive film (low resistance metal) is transferred onto a base, i.e., the first conductive film, in order to decrease resistance of connection wiring (the second periphery electric wiring 22) between the respective TCPs. However, in the present invention, the method for forming the second conductive film is not limited to the method above. For example, the following methods (1) and (2) can also be adopted.

(1) Ink Jet Method

Figure 11:
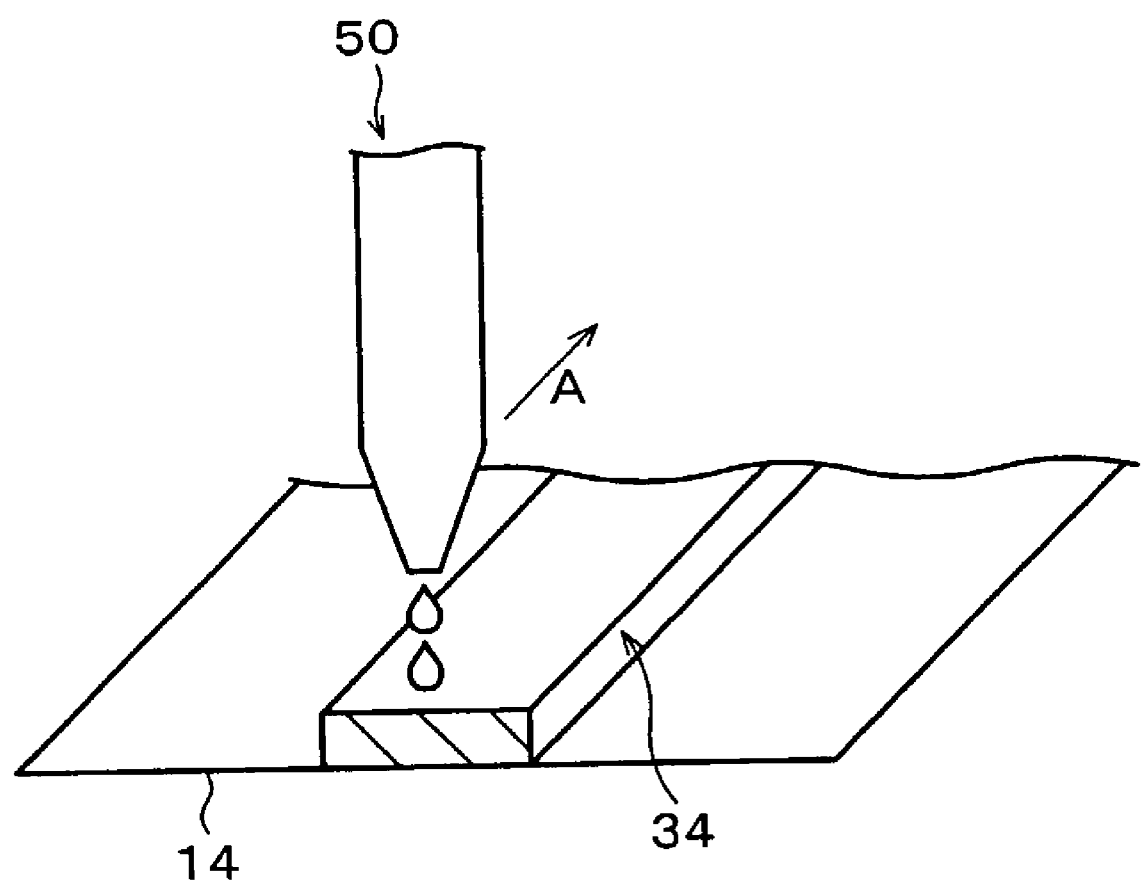
FIG. 11 is a pattern diagram showing a process for forming a second conductive film by an ink jet method.

FIG. 11 schematically shows the case of forming the second conductive film by an ink jet method.

This ink jet method uses an ink of a solution in which metal fine particles of such as Cu, Au, Ag, Ni, Pd, or Sn are dispersed, or a solution containing organic metal compounds such as the one disclosed in Japanese Laid-Open Patent Application Tokukai 2002-339076 (published on Nov. 27, 2002) or the one disclosed in Japanese Laid-Open Patent Application Tokukai 2002-338891 (published on Nov. 27, 2002). Further, as shown in FIG. 11, the ink is sprayed to a predetermined area by the ink jet head 50 moving in the direction denoted by an arrow A, so as to form the second conductive film 34 on the frame area 14 of the active matrix substrate 11. In this manner, the second conductive film 34 can be formed by a noticeably easy process.

(2) Wet Plating Method

In the wet plating method, the second conductive film (such as Cu, Au, Ag, Ni, Pd, or Sn) can be formed only on a certain predetermined area (the area where the second conductive film is supposed to be formed) by applying a small quantity of a catalyst made of such as Pd, Au, Ag or Cu. In this manner, the second conductive film 34 is formed only on the area where the catalyst is applied.

Figure 12:
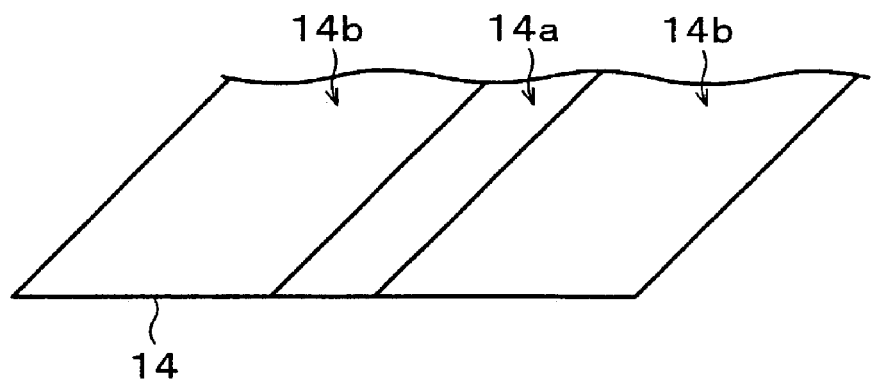
FIGS. 12(a) through 12(c) are pattern diagrams showing respective manufacturing processes for forming a second conductive film by a wet plating method.
Figure 12:
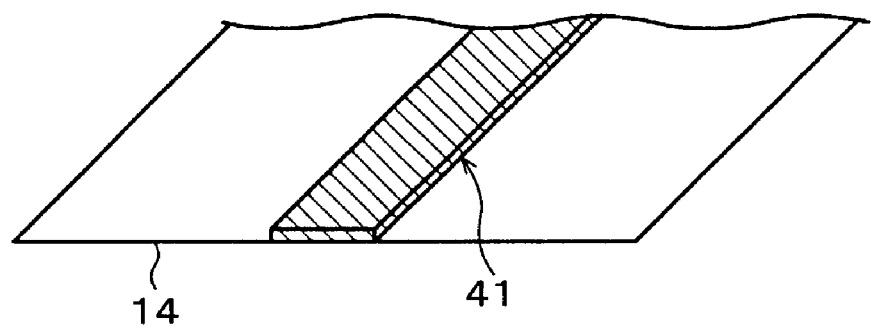
Figure 12:
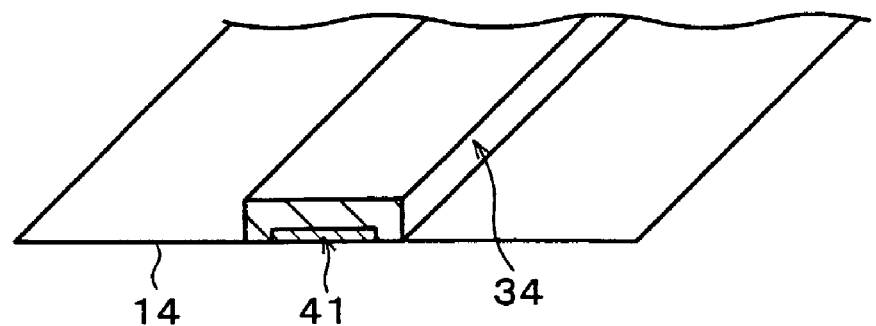

FIGS. 12(a) through 12(c) show respective manufacturing processes for forming the second conductive film by the wet plating method.

Firstly, in order to apply a metal (such as Pd, Au, Ag, or Cu) as the catalyst only to a predetermined area, the frame area 14 of the active matrix substrate 11 is arranged so that the surface condition (such as the wetness) of the area where the second conductive film is formed is different from that of the remaining area. More specifically, as shown in FIG. 12(a), the frame area 14 of the active matrix substrate 111 includes a hydrophilic section 14a having hydrophilic as the area on which the second conductive film is formed, and also includes a water repellent section 14b having water repellence for the remaining area.

Next, as shown in FIG. 12(b), a small quantity of a catalyst made of such as Pd, Au, Ag, or Cu is applied onto the hydrophilic section 14a so as to form a catalyst layer 41. This catalyst layer 41 may be formed by the following method (i) or (ii), for example.

(i) A method of soaking the substrate having the lamination of the respective layers in a solution including catalyst metal ion so that the catalyst metal is adhered only to a certain predetermined area (the area where the second conductive film is-formed).

(ii) A method of spraying ink containing dispersed metal fine particles as the catalyst, or spraying ink containing metal compounds as the catalyst, with respect to a certain predetermined area by the ink jet method.

Then, as shown in FIG. 12(c), the second conductive film 34 is formed by growing a plating film by using the electroless plating method according to the pattern of the catalyst layer 41 thus formed in the previous process.

The ink used in the (1) ink jet method includes a particular material which is manufactured with a specific instruction and therefore the cost of material tends to be high. In contrast, the (2) wet plating method allows the use of plating material of lower cost, and therefore effective for the case of providing a thick second conductive film. Further, to provide a thick second conductive film, the (1) ink jet method requires a large dropping quantity, or a recoating process, and therefore the pattern accuracy tends to decrease. On the other hand, in the (2) wet plating method, the pattern accuracy does not decrease even when the second conductive film becomes thick, since the plating film is grown according to the pattern of the catalyst layer.

Note that, as to the method of forming the second conductive film by plating, the electroplating method may also be adopted in addition to the foregoing electroless plating method.

The present embodiment deals with an electronic component having a driver IC as the electronic component provided in the wiring substrate; however, the present invention is not limited to this type of component but may also be adopted for a wiring substrate having other various electronic components such as a memory. Further, in the present invention, a COG mounting method or a TCP mounting method is preferable as the mounting method for the wiring substrate having a driver IC. On this account, it is possible to easily prevent connection failure of periphery electric wiring.

Further, the present embodiment deals with a liquid crystal display device as the electronic device having the wiring substrate; however, the present invention is not limited to this type of device but may also be adopted for other electronic devices. A preferable example can be a flat sensor panel (X-ray imaging device, document scanning device etc.) including an active matrix substrate. Further, the display device of the present invention is not limited to the liquid crystal display panel but may be adopted for other display devices, such as an EL display, an electrophoretic display, an electronic toner display, or a plasma display.

Note that, in the present invention, the first conductive film and the second conductive film in the wiring substrate may be adhered together through an adhesion member having an anisotropic conduction characteristic.

With the foregoing arrangement, it is possible to electrically and mechanically connect the first conductive film formed on the substrate to the second conductive film having low resistance and provided on the first conductive film. Further, since the adhesion member has an anisotropic conduction characteristic, it is possible to prevent a short circuit between adjacent ones of periphery electric wirings.

The second conductive film of the wiring substrate is preferably formed by including copper. With this arrangement, the resistance of the second conductive film can be further reduced, and the second conductive film having $\mu$m thickness can easily be formed by a plating method.

The second conductive film of the wiring substrate preferably has a thickness of not less than 1 $\mu$m and not more than 15 $\mu$m. This arrangement can provide electric wiring having desirably low resistance.

The second conductive film of the wiring substrate is preferably a transferred film which is first formed on a supporting base separated from the wiring substrate, and then transferred to the wiring substrate.

With this arrangement, the second conductive film, which is thicker than the first conductive film, can easily be formed only on a certain predetermined area. Further, since the second conductive film is formed on a supporting base separated from the wiring substrate, it is not necessary to soak the wiring substrate in a plating bath etc. even when the second conductive film is formed by a plating method, thus reducing damage of the wiring substrate.

The supporting base on which the transferred film is formed may be made by including a polyimide resin. With this arrangement, the adherence between the polyimide resin and the second conductive film can easily be reduced by heating, thus easily transferring the second conductive film onto the wiring substrate.

The second conductive film of the wiring substrate may be formed on the supporting base via a thermoplastic resin layer. With this arrangement, since the thermoplastic resin layer can be softened by heating, the conductive film can easily be peeled off from the supporting base so as to be transferred onto the wiring substrate.

The second conductive film of the wiring substrate may be formed on the supporting base via a photodegradation resin layer. With this arrangement, since the adherence between the photodegradation resin layer and the conductive film can be reduced by light irradiation, the conductive film can easily be peeled off from the supporting base so as to be transferred onto the wiring substrate. Note that, the photodegradation resin layer may be an ultraviolet degradation resin layer which degrades by ultraviolet irradiation.

The second conductive film may be made of a solution in which metal fine particles are dispersed, or of a solution containing organic metallic compounds.

With this arrangement, the second conductive film can easily be formed by an ink jet method with the solution in which metal fine particles are dispersed, or with the solution containing organic metallic compounds.

The second conductive film may be a wet coating film.

This arrangement is effective in the case of forming a thick second conductive film since the second conductive film can be formed by a relatively cheap plating material. Further, the wet plating film grows according to the pattern of a catalyst layer, and therefore the pattern accuracy does not decrease even when forming a thick film.

The display device of the present invention may be arranged so that the electric wiring includes first periphery electric wiring and second periphery electric wiring, the first periphery electric wiring connecting the electric wiring in the display area and the electronic components, and second periphery electric wiring being formed by including at least the second conductive film, and connecting the electronic components to one another.

In this display device, the resistance of the second periphery electric wiring connecting the electronic components to one another is reduced by including the second conductive film. Thus, with this arrangement, it is not necessary to provide wirings for the respective electronic devices having such as an IC driver from the driving power source etc. outside of the display panel, thus greatly decreasing the number of wirings. As a result, the area of the display device other than the display area can be reduced.

The display may be arranged so that the second periphery electric wiring connects adjacent ones of the electronic components to one another.

Since the second periphery electric wiring includes the second conductive film having low resistance, this arrangement allows provision of a bus line which traverses over the whole periphery area of the display device without increasing the resistance of the electric wiring connecting the adjacent electronic components. On this account, it is possible to obtain a display device not requiring an external circuit board.

The display may be arranged so that the second periphery electric wiring further includes power supply wiring of the electronic components.

With this arrangement, a driving signal from the power source may be supplied by low resistance power source wiring, thus desirably carrying out signal propagation.

The manufacturing method of the present invention may be arranged so that the step (b) includes the sub-steps of (d) forming the second conductive film on a supporting base separated from the substrate; and (e) transferring the second conductive film onto the first conductive film by laminating the second conductive film on at least one portion of the first conductive film, so as to form the electric wiring.

With this arrangement, the second conductive film, which is thicker than the first conductive film, can easily be formed only on a certain predetermined area by a transfer method. Further, the second conductive film is formed on a supporting base separated from the wiring substrate, thus reducing damage of the wiring substrate.

The manufacturing method of the present invention may be arranged so that the step (b) further includes the sub-step of (f) providing an adhesion member having an anisotropic conductive characteristic on the first conductive film and/or the second conductive film, between the step (d) and the step (e).

With this method, it is possible to electrically and mechanically connect the first conductive film to the second conductive film provided on the first conductive film. Further, since the adhesion member has an anisotropic conduction characteristic, it is possible to prevent a short circuit between adjacent ones of periphery electric wirings.

The manufacturing method of the present invention may be arranged so that the step (b) is performed by an ink jet method.

With this arrangement, the second conductive film can be formed by a significantly simple process.

The manufacturing method of the present invention may be arranged so that the step (b) is performed by a wet plating method.

This arrangement is effective in the case of forming a thick second conductive film since the second conductive film can be formed by a relatively cheap plating material. Further, the wet plating film grows according to the pattern of a catalyst layer, and therefore the pattern accuracy does not decrease even when forming a thick film.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A wiring substrate comprising:
   a substrate;
   a plurality of electronic components disposed on the substrate; and at least first and second groups of electric wiring patterned on the substrate and having portions thereof sandwiched between the substrate and the electronic components, wherein the second group of electric wiring provides connection between the plurality of electronic components, the first group of electric wiring provides connection from the plurality of electronic components to components other than the plurality of electronic components, the first group of electric wiring is formed of a first conductive film, and includes a second conductive film thicker than the first conductive film over at least a majority portion thereof, and portions of the at least first and second groups of electric wiring sandwiched between an electronic component and the substrate have the same thickness.

2. The wiring substrate as set forth in claim 1, wherein:
the first conductive film and the second conductive film are adhered together through an adhesion member having an anisotropic conduction characteristic.

3. The wiring substrate as set forth in claim 1, wherein:
the second conductive film is formed by including copper.

4. The wiring substrate as set forth in claim 1, wherein:
the second conductive film has a thickness of not less than 1 $\mu$m and not more than 15 $\mu$m.

5. The wiring substrate as set forth in claim 1, wherein:
the second conductive film is a transferred film which is first formed on a supporting base separated from the wiring substrate, and then transferred to the wiring substrate.

6. The wiring substrate as set forth in claim 5, wherein:
the supporting base is formed by including a polyimide resin.

7. The wiring substrate as set forth in claim 5, wherein:
the second conductive film is formed on the supporting base via a thermoplastic resin layer.

8. The wiring substrate as set forth in claim 5, wherein:
the second conductive film is formed on the supporting base via a photodegradation resin layer.

9. The wiring substrate as set forth in claim 1, wherein:
the second conductive film is made of a solution in which metal fine particles are dispersed, or of a solution containing organic metallic compounds.

10. The wiring substrate as set forth in claim 1, wherein:
the second conductive film is a wet coating film.

11. The wiring substrate as set forth in claim 1, wherein:
the portions of the at least first and second groups of electric wiring sandwiched between an electronic component and the substrate have either a monolayer structure of a first conductive film or a second conductive film, or a lamination structure of both the first conductive film and the second conductive film.

12. The display device as set forth in claim 1, wherein:
the second group of electric wiring connects adjacent electronic components to each other and sequentially propagates a signal first inputted to one electronic component to an electronic component adjacent thereto.

13. A display device, comprising:
a display area for displaying an image; and
a periphery area provided on a periphery of the display area for transmitting a signal to the display area,
the periphery area including a wiring substrate having a substrate; electronic components disposed on the substrate; and at least first and second groups of electric wiring patterned on the substrate having portions thereof sandwiched between the substrate and the electronic components,
the first group of electric wiring connects the electronic components to the display area,
the second group of electric wiring connects the electronic components to each other,
the first group of electric wiring including a first conductive film, and a second conductive film thicker than the first conductive film over at least a majority portion thereof, and
portions of the at least first and second groups of electric wiring sandwiched between an electronic component and the substrate have the same thickness.

14. The display device as set forth in claim 13, wherein:
the electric wiring includes first periphery electric wiring and second periphery electric wiring, the first periphery electric wiring connecting the electric wiring in the display area and the electronic components, and second periphery electric wiring being formed by including at least the second conductive film, and connecting the electronic components to one another.

15. The display device as set forth in claim 14, wherein:
the second periphery electric wiring connects adjacent ones of the electronic components to one another.

16. The display device as set forth in claim 14, wherein:
the second periphery electric wiring further includes power supply wiring of the electronic components.

17. The wiring substrate as set forth in claim 13, wherein:
the portions of the at least first and second groups of electric wiring sandwiched between an electronic component and the substrate have either a monolayer structure of a first conductive film or a second conductive film, or a lamination structure of both the first conductive film and the second conductive film.

* * * * *